(12) United States Patent
Pai

(10) Patent No.: US 8,016,471 B2
(45) Date of Patent: Sep. 13, 2011

(54) LIGHT EMITTING DIODE DEVICE AND APPLICATIONS THEREOF

(75) Inventor: Wei-Ming Pai, Tainan County (TW)

(73) Assignee: Chi Mei Lighting Technology Corp, Tainan County (TW)

( * ) Notice: Subject to any disclaimer, the term of this patent is extended or adjusted under 35 U.S.C. 154(b) by 0 days.

(21) Appl. No.: 11/927,487

(22) Filed: Oct. 29, 2007

(65) Prior Publication Data

US 2009/0015754 A1  Jan. 15, 2009

Related U.S. Application Data

(60) Provisional application No. 60/949,478, filed on Jul. 12, 2007.

(51) Int. Cl.
*F21V 7/04* (2006.01)

(52) U.S. Cl. ......... 362/612; 362/800; 362/97.3; 257/99; 349/65

(58) Field of Classification Search .................. 362/612, 362/97.3, 800, 613, 630–631; 349/62, 65, 349/69; 257/99
See application file for complete search history.

(56) References Cited

U.S. PATENT DOCUMENTS

| 5,803,573 | A  | * | 9/1998  | Osawa et al. ................. 362/612 |
| 6,036,328 | A  | * | 3/2000  | Ohtsuki et al. ................ 362/612 |
| 6,834,977 | B2 | * | 12/2004 | Suehiro et al. ................ 362/187 |
| 6,919,586 | B2 | * | 7/2005  | Fujii ............................. 257/100 |
| 7,543,970 | B2 | * | 6/2009  | Kiyohara et al. ............. 362/612 |
| 2002/0001192 | A1 | * | 1/2002 | Suehiro et al. ................ 362/240 |
| 2007/0153159 | A1 |   | 7/2007 | Jung |
| 2007/0171673 | A1 | * | 7/2007 | Song et al. .................... 362/612 |
| 2008/0291365 | A1 |   | 11/2008 | Woo et al. |
| 2011/0121345 | A1 | * | 5/2011 | Andrews et al. ................ 257/98 |

* cited by examiner

*Primary Examiner* — Robert May
(74) *Attorney, Agent, or Firm* — Morris Manning Martin LLP; Tim Tingkang Xia, Esq.

(57) ABSTRACT

A light emitting diode (LED) device and the applications are provided, wherein the LCD device comprises a light emitting direction and a cross-section perpendicular to the light emitting direction, wherein the cross-section has a first height perpendicular to the light emitting direction and a light emitting area having a second height perpendicular to the light emitting direction, the second height is substantially shorter than 70% of the first height.

19 Claims, 5 Drawing Sheets

LIGHT EMITTING DIODE DEVICE AND APPLICATIONS THEREOF

RELATED APPLICATIONS

This application claims priority to U.S. provisional patent application Ser. No. 60/949,478, filed on Jul. 12, 2007, entitled "LIGHT EMITTING DIODE DEVICE AND APPLICATIONS THEREOF", which is hereby incorporated by reference into the present application.

FIELD OF THE INVENTION

The present invention relates to a light emitting diode (LED) and applications thereof.

BACKGROUND OF THE INVENTION

LED device that has advantages of low power consumption, less heat generation, long life, small size, impact tolerance, high speed, free mercury and good optical performance has been applied to provided an optical device light source with steady waive length or been applied as an indicator of an electronic device. The brightness and operation life of a LED device has been tremendously improved along with the development of the optical technology, and may serve as the primary light source of an electronic device in the future.

For example, a LED device is available to a thinned liquid crystal display (LCD) in compliance with the design trend to downsize.

FIG. 1 partially illustrates a cross section view of a prior back light module 100 applied in a LCD with a LED device as a light source. The back light module 100 comprises a light guide plate 104 and at least one LED device 101 coupling with the light guide plate 104. The LED device 101 having a die 109 is fixed and electrically connected to a control circuit board 106 via a lead 102, wherein the control circuit board 106 is set on a rear plate 103 of the back light module 100. Light emitting from the die 109 of the LED device 101 either is diffused directly by the light guide plate 104 and or reflected by the reflector 105 prior to the diffusion of the light guide plate 106. The diffused light is then emitted out of the back light module 100 to provide the LCD with a well-mixed plane light source.

In general the lead 102 of the LED device 101 is fixed on the control circuit board 106 by a surface mounting technology. As shown in FIG. 1, when the LED device 101 is thick enough a rear lead design is applied, wherein the lead 102 set on the rear side of the LED device 101 can be securely mounted on the control circuit board 106 that is perpendicular with the light emitting direction R1 of the LED device 101.

However, since a light guide plate is a primary element of a LCD, when a thinner LCD is required the light guide plate should be thinned as well. Thus a decreased thickness of the LED coupled with the light guide plate may also be required. In that case, the lead 102 set on the rear side of the LED device 101 has smaller contact area to mount on the control circuit board 106. The lead 102 may not be secured on the control circuit board 106 firmly, and heat generated by the LED device 101 may not be dissipated effectively due to the smaller contact area. The manufacture yield of the LCD may be decreased.

To resolve these problems, a lateral lead design is then adopted. FIG. 2 partially illustrates a cross section view of another prior back light module 200 applied in a LCD. The lateral lead design applies lead 202 set on the lateral side of LED device 201 and mounted on the control circuit board 206 that is parallel with the light emitting direction R2 of the LED device 201.

However the lateral lead design still does not resolve the problems of heat dissipating due to the decreased contact area between the lead 202 and the control circuit board 206. Because the metal structure of the lead 202 of the lateral lead design may be partially torn by undue fold compared with the lead 102 adopted by the rear lead design. The lead 201 with undue fold may obstruct the primary heat dissipation of the LED device 201 and affect the optical performance of the LED device 201.

SUMMARY OF THE INVENTION

Therefore, it is desirable to provide a method for promoting the accuracy and precision for detecting foreign objects, thereby benefiting the monitoring of foreign objects on the working stage or a substrate.

One aspect of the present invention is to provide a LED device comprising a light emitting direction and a cross-section perpendicular to the light emitting direction. The cross-section has a first height perpendicular to the light emitting direction and a light emitting area having a second height perpendicular to the light emitting direction, wherein the second height is substantially shorter than 70% of the first height.

Another aspect of the present invention is to provide a back light module comprising a rear plate, a light guide plate and a LED device. The light guide plate has a light-receiving surface for coupling with the LED device to receive light emitting from the LED device. The LED device comprises a cross-section perpendicular to the light emitting direction of the LED device. The cross-section has a first height perpendicular to the light emitting direction and a light emitting area having a second height perpendicular to the light emitting direction, wherein the second height is substantially shorter than 70% of the first height.

Still another aspect of the present invention is to provide a LCD comprising a LCD panel and a back light module set on one side of the LCD panel. The back light module comprises a rear plate, a light guide plate and a LED device, wherein the light guide plate has a sidewall coupling with the LED device for receiving light emitting from the LED device. The LED device comprises a cross-section perpendicular to the light emitting direction of the LED device. The cross-section has a first height perpendicular to the light emitting direction and a light emitting area having a second height perpendicular to the light emitting direction, wherein the second height is substantially shorter than 70% of the first height.

In accordance with above descriptions, the features of the present invention are as follows. When a light guide plate is thinned a rear lead design is still adopted to provide a LED device a greater contact area, so that the LED device can be secured firmly on a control circuit board and an undue fold can also be avoided to conduct on the lead of the LED. Thus the heat dissipation of the LED device can be improved. While, the light emitting area identified on a cross-section of the LED is correspondingly scaled down for coupling the thinned light guide plate, wherein the light emitting area has a second height substantially shorter than 70% of a first height of the cross-section.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

The foregoing aspects and many of the attendant advantages of this invention will become more readily appreciated as a preferred embodiment of a LCD 300 becomes better understood by reference to the following detailed description, when taken in conjunction with the accompanying drawings.

Figure 1:
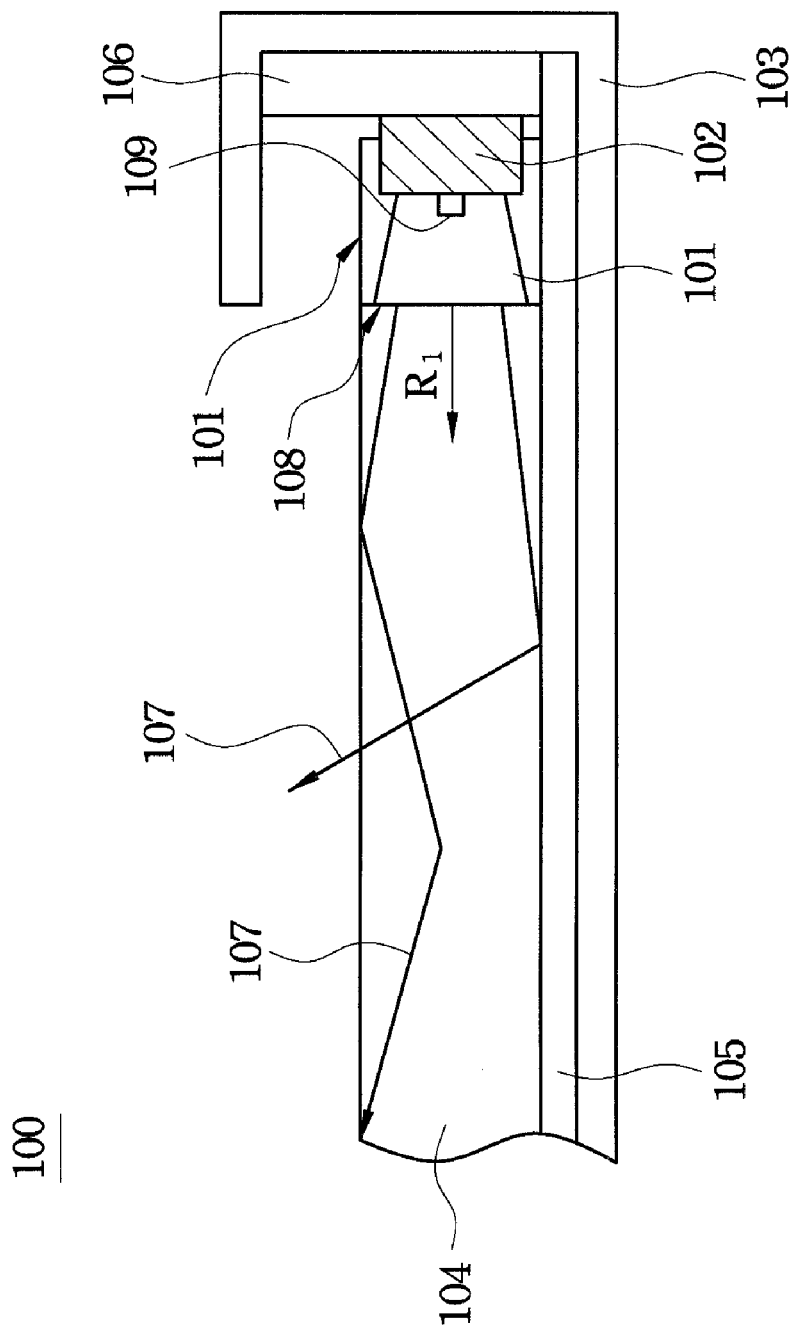
FIG. 1 partially illustrates a cross section view of a prior back light module 100 applied in a LCD with a LED device as a light source.
Figure 2:
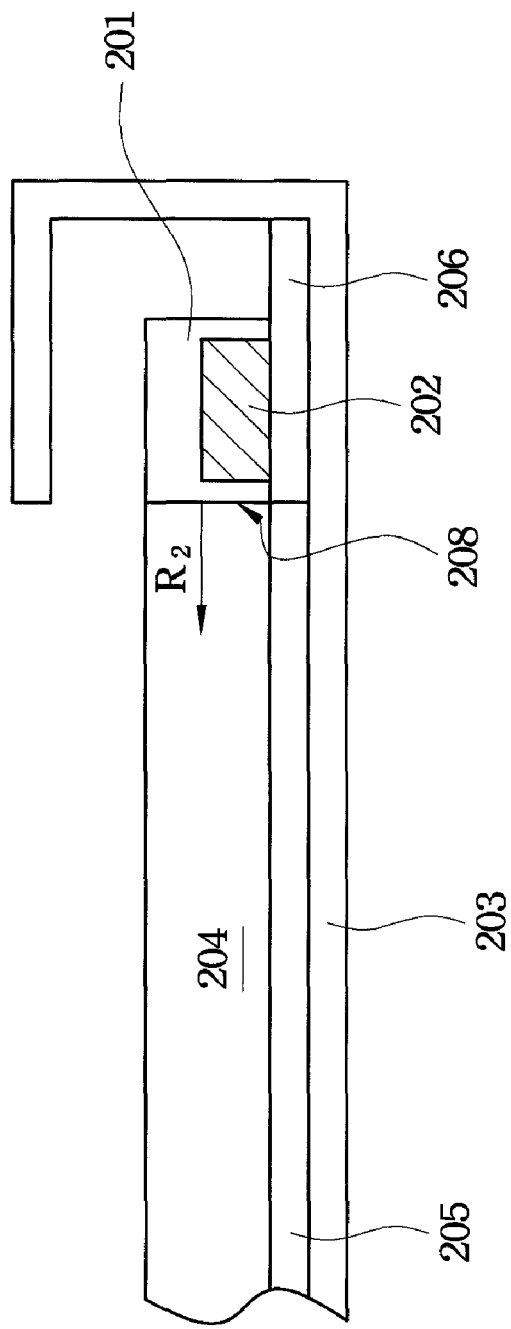
FIG. 2 partially illustrates a cross section view of another prior back light module 200 applied in a LCD.
Figure 3A:
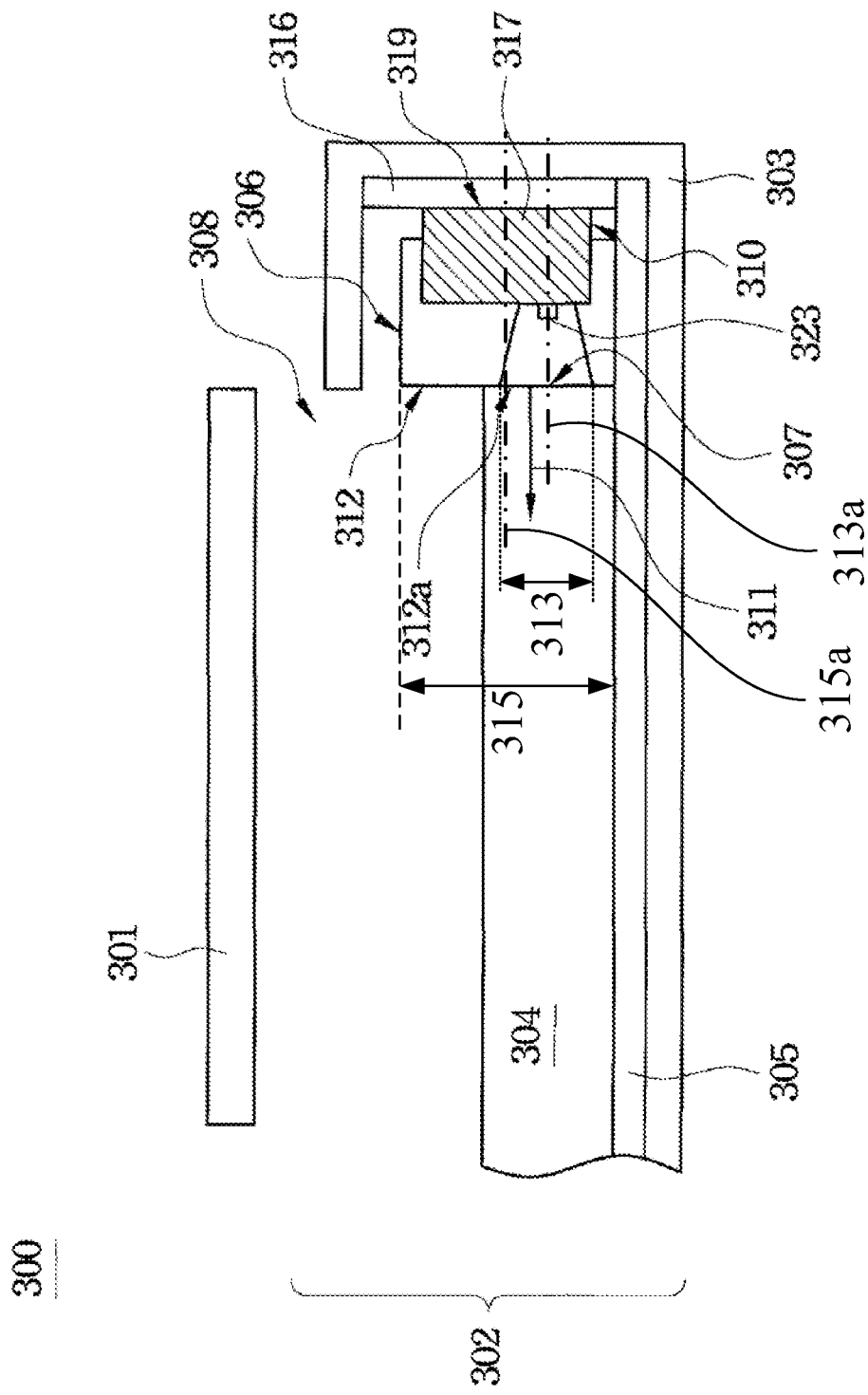
FIG. 3A illustrates a cross-section view of a LCD 300 in accordance with a preferred embodiment of the present invention.

FIG. 3A illustrates a cross-section view of a LCD 300 in accordance with a preferred embodiment of the present invention. The LCD 300 comprises a LCD panel 301 and a back light module 302 set on one side of the LCD panel 301. The back light module 302 comprises a rear plate 303, a light guide plate 304, a reflector 305 and a light source 306, wherein the light guide plate 304 has a light-receiving surface 307 for coupling with the light source 306.

Figure 3B:
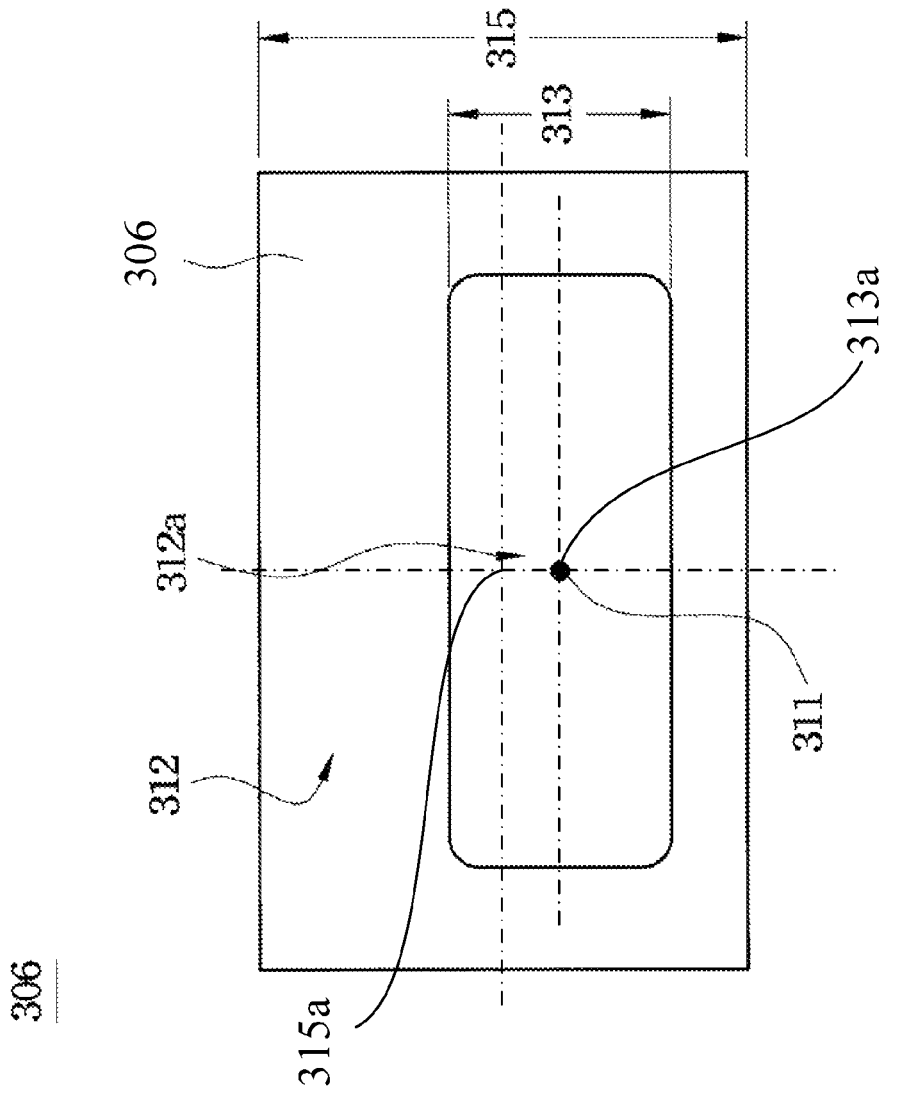
FIG. 3B illustrates a front view of a light source 306 against the light emitting direction 311 of the light source 306.

FIG. 3B illustrates a front view of a light source 306 against the light emitting direction 311 of the light source 306. Light that emits from the light source 306 along with the light emitting direction 311 is received by the light-receiving surface 307 of the light guide plate 304. The received light is then either directly diffused or is diffused after reflected by the reflector 305, and the diffused light is then emitted from a light emitting opening 308 of the back light module 302.

In an embodiment of the present invention, the light source 306 of the LCD 300 is a LED device (hereinafter referred to as "the LED device 306") coupling with the light receiving surface 307 of the light guide plate 304, wherein one end of the LED device 306 couples with the light-receiving surface 307 of the light guide plate 304; and another end of the LED device 306 is fixed and electrically connected to a controlled circuit board 316.

Figure 3C:
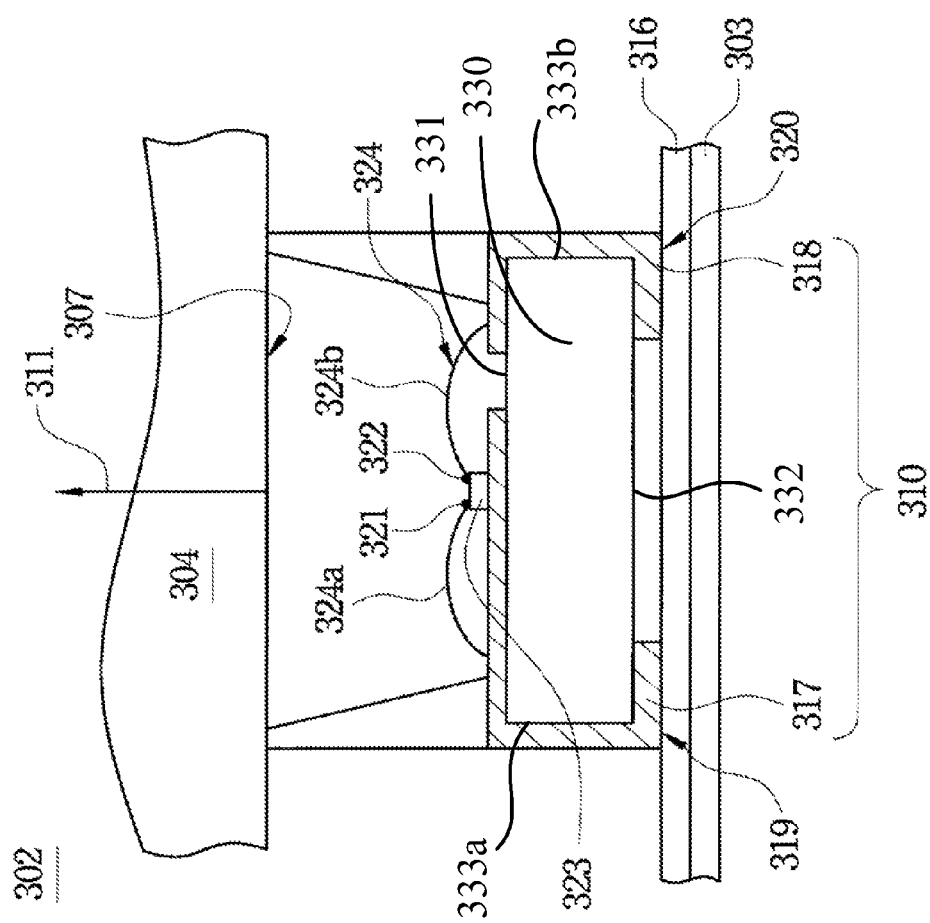
FIG. 3C illustrates a cross-section view of the LED device 306 perpendicular to the cross section shown in FIG. 3A.

FIG. 3C illustrates a cross-section view of the LED device 306 perpendicular to the cross section shown in FIG. 3A. The LED device 306 comprises a base 330, a LED die 323, at least one bonding wire 324 and lead 310. The lead 310 consists of a first finger 317 and a second finger 318 separated from the first finger 317. The base 330 has a first surface 331, a second surface 332 opposite to the first surface 331, a first side surface 333a and a second side surface 333b opposite to the first side surface 333b, where each of the first surface 331 and the second surface 332 is perpendicular to the light emitting direction 311 (i.e., parallel to the cross-section 312 of the LED device 306). The first finger 317 and the second finger 318 respectively extend from the first surface 331 of the base 330 through the first and second side surfaces 333a and 333b of the base 330 onto the second surface 332 of the base 330 and are connected to both of the first surface 331 of the base 330 and the second surface 332 of the base 330 through the first and second side surfaces 333a and 333b of the base 330. The LED die 323 has a first electrode 321 and a second electrode 322 and is disposed on the first surface 331 of the base 330. The LED die 323 is electrically connected to the lead 310 via the at least one bonding wire 324. For example, in the present embodiment a bonding wire 324a connects a first electrode 321 of the LED die 323 with the first finger 317 of the lead 310; and a bonding wire 324b connects a second electrode 322 of the LED die 323 with the second finger 318 of the lead 310. The first finger 317 is mounted on a first mounting surface 319 of the control circuit board 316; and the second finger 318 is mounted on a second mounting surface 320 of the control circuit board 316, wherein the first mounting surface 319 and the second mounting surface 320 are parallel with a cross-section 312 of the LED device 306.

In the embodiments of the present invention the cross-section 312 that involves a light-emitting area 312a is perpendicular to the light emitting direction 311 of the LED device 306. The light emitting area 312a has a first height (dimension) 313 perpendicular to the light emitting direction 311. The cross-section 312 has a second height (dimension) 315 perpendicular to the light emitting direction 311, wherein the first height 313 is substantially shorter than 70% of the second height 315, as shown in FIGS. 3A and 3B. Furthermore, the light emitting area 312a has a first center 313a, and the cross-section 312 has a second center 315a, where the first center 313a is below the second center 315a, as shown in FIGS. 3A and 3B.

In accordance with the above embodiments, the features of the present invention are that a rear lead design is adopted to provide a LED device a greater contact area when a light guide plate of a LCD is thinned, so that the LED device can be secured firmly on a control circuit board and an undue fold can also be avoided to conduct on the lead of the LED. Thus the heat dissipation of the LED device can be improved. While, the light emitting area identified on a cross-section of the LED is correspondingly scaled down for coupling the thinned light guide plate, wherein the light emitting area has a second height substantially shorter than 70% of a first height of the cross-section.

Accordingly the embodiments of the present invention not only can provide a LCD in compliance with the design trend to scale down its size but also can give consideration to the manufacturing cost of the LCD. The problems of poor heat dissipation that occur in a LED device with the lateral lead design also can be resolved.

It should be noted that the height of the cross-section must be measured along a predetermined direction inconsistent with the direction in measuring the thickness of the light guide plate. For example, the aforementioned light emitting direction of the LED device is perpendicular with the direction in measuring the thickness of the light guide plate.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:
1. A light emitting diode (LED) device, comprising:
a light emitting area that emits a majority of light of the light emitting diode device, the light emitting area comprising a light emitting direction and having a first dimension perpendicular to the light emitting direction, wherein the light emitting area has a first center;
a cross-section substantially perpendicular to the light emitting direction, the cross section having a second dimension parallel to the first dimension, wherein the first dimension is substantially shorter than 70% of the second dimension, the cross-section has a second center, and the first center is below the second center;

a base having a first surface, a second surface opposite to the first surface, a first side surface, and a second side surface opposite to the first side surface, wherein each of the first surface and the second surface is perpendicular to the light emitting direction;

a LED die disposed on the first surface of the base and having a first electrode and a second electrode;

a first finger electrically connected to the first electrode; and a second finger separated from the first finger and electrically connected to the second electrode, wherein the first finger and the second finger respectively extend from the first surface of the base through the first and second side surfaces of the base onto the second surface of the base and are connected to both of the first surface of the base and the second surface of the base through the first and second side surfaces of the base.

2. The LED device of claim 1, wherein the first dimension is substantially shorter than 60% of the second dimension.

3. The LED device of claim 1, wherein the first finger is mounted on a first mounting surface of a control circuit board, the second finger is mounted on a second mounting surface of the control circuit board, and the first mounting surface and the second mounting surface are parallel with the cross-section of the LED device.

4. The LED device of claim 1, wherein the first dimension is a first height, and the second dimension is a second height.

5. The LED device of claim 1, further including two bonding wires respectively connecting the first electrode with the first finger and the second electrode with the second finger.

6. A back light module comprising:

a light guide plate having a light receiving surface set on a sidewall of the light guide plate; and an LED device for coupling with the light-receiving surface, wherein the LED device comprises:

a light emitting area that emits a majority of light of the light emitting diode device, the light emitting area comprising a light emitting direction and having a first dimension perpendicular to the light emitting direction, wherein light emits along the light emitting direction and is received by the light receiving surface, and the light emitting area has a first center;

a cross-section substantially perpendicular to the light emitting direction, the cross-section having a second dimension parallel to the first dimension, wherein the first dimension is substantially shorter than 70% of the second dimension, the cross-section has a second center, and the first center is below the second center;

a base having a first surface, a second surface opposite to the first surface, a first side surface, and a second side surface opposite to the first side surface, wherein each of the first surface and the second surface is perpendicular to the light emitting direction;

a LED die disposed on the first surface of the base and having a first electrode and a second electrode;

a first finger electrically connected to the first electrode; and a second finger separated from the first finger and electrically connected to the second electrode, wherein the first finger and the second finger respectively extend from the first surface of the base through the first and second side surfaces of the base onto the second surface of the base and are connected to both of the first surface of the base and the second surface of the base through the first and second side surfaces of the base.

7. The back light module of claim 6, wherein the first dimension is substantially shorter than 60% of the second dimension.

8. The back light module of claim 6, wherein the first finger is mounted on a first mounting surface of a control circuit board, the second finger is mounted on a second mounting surface of the control circuit board, and the first mounting surface and the second mounting surface are parallel with the cross-section of the LED device.

9. The back light module of claim 6, wherein the first dimension is a first height, and the second dimension is a second height.

10. The back light module of claim 6, further including two bonding wires respectively connecting the first electrode with the first finger and the second electrode with the second finger.

11. The back light module of claim 6, further including a rear plate, wherein the light guide plate is disposed on the rear plate.

12. The back light module of claim 11, further including a reflector disposed between the rear plate and the light guide plate.

13. A liquid crystal display (LCD) comprising:

an LCD panel; and a back light module set on one side of the LCD panel, wherein the back light module comprises:

a light guide plate having a light receiving surface set on a sidewall of the light guide plate; and an LED device for coupling with the light-receiving surface, wherein the LED device comprises:

a light emitting area that emits a majority of light of the light emitting diode device, the light emitting area further comprising a light emitting direction and having a first dimension perpendicular to the light emitting direction, wherein light emits along the light emitting direction and is received by the light receiving surface, and the light emitting area has a first center;

a cross-section substantially perpendicular to the light emitting direction, the cross-section having a second dimension parallel to the first dimension, wherein the first dimension is substantially shorter than 70% of the second dimension, the cross-section has a second center, and the first center is below the second center;

a base having a first surface, a second surface opposite to the first surface, a first side surface, and a second side surface opposite to the first side surface, wherein each of the first surface and the second surface is perpendicular to the light emitting direction;

a LED die disposed on the first surface of the base and having a first electrode and a second electrode;

a first finger electrically connected to the first electrode; and a second finger separated from the first finger and electrically connected to the second electrode, wherein the first finger and the second finger respectively extend from the first surface of the base through the first and second side surfaces of the base onto the second surface of the base and are connected to both of the first surface of the base and the second surface of the base through the first and second side surfaces of the base.

14. The LCD of claim 13, wherein the first dimension is substantially shorter than 60% of the second dimension.

15. The LCD of claim 13, wherein the first finger is mounted on a first mounting surface of a control circuit board, the second finger is mounted on a second mounting surface of the control circuit board, and the first mounting surface and the second mounting surface are parallel with the cross-section of the LED device.

16. The LCD of claim 13, wherein the first dimension is a first height, and the second dimension is a second height.

17. The LCD of claim 13, wherein the LED device further includes two bonding wires respectively connecting the first electrode with the first finger and the second electrode with the second finger.

18. The LCD of claim 13, wherein the back light module further includes a rear plate, wherein the light guide plate is disposed on the rear plate.

19. The LCD of claim 18, wherein the back light module further includes a reflector disposed between the rear plate and the light guide plate.

\* \* \* \* \*